(12) United States Patent
Karavakis et al.

(10) Patent No.: US 7,834,447 B2
(45) Date of Patent: Nov. 16, 2010

(54) COMPLIANT THERMAL CONTACTOR

(75) Inventors: Konstantine N. Karavakis, Pleasanton, CA (US); Thomas H. Di Stefano, Monte Sereno, CA (US); Peter T. Di Stefano, San Jose, CA (US)

(73) Assignee: Centipede Systems, Inc., San Jose, CA (US)

( * ) Notice: Subject to any disclaimer, the term of this patent is extended or adjusted under 35 U.S.C. 154(b) by 473 days.

(21) Appl. No.: 11/811,458

(22) Filed: Jun. 11, 2007

(65) Prior Publication Data

US 2008/0290504 A1 Nov. 27, 2008

Related U.S. Application Data

(63) Continuation-in-part of application No. 11/805,466, filed on May 22, 2007, now Pat. No. 7,719,816.

(51) Int. Cl.
*H01L 23/34* (2006.01)
(52) U.S. Cl. .............. 257/713; 257/E21.505; 257/E23.104; 438/122
(58) Field of Classification Search ........... 257/713, 257/E21.505, E23.104; 438/122
See application file for complete search history.

(56) References Cited

U.S. PATENT DOCUMENTS

| | | | |
|---|---|---|---|
| 3,944,181 A | 3/1976 | Anthony | ........... 248/358 R |
| 4,861,641 A | 8/1989 | Foster et al. | |
| 4,994,903 A | 2/1991 | Wroe et al. | ............... 357/81 |
| 5,151,777 A | 9/1992 | Akin et al. | ................ 357/81 |
| 5,213,868 A | 5/1993 | Liberty et al. | ........... 428/131 |
| 5,214,000 A | 5/1993 | Chazan et al. | ........... 437/209 |
| 5,298,791 A * | 3/1994 | Liberty et al. | ........... 257/707 |
| 5,552,633 A | 9/1996 | Sharma | |
| 5,657,206 A | 8/1997 | Pedersen et al. | ......... 361/772 |
| 5,659,952 A | 8/1997 | Kovac et al. | ............... 29/840 |
| 5,885,849 A | 3/1999 | DiStefano et al. | ......... 438/108 |
| 5,915,170 A | 6/1999 | Raab et al. | ............... 438/118 |
| 6,020,220 A | 2/2000 | Gilleo et al. | ............. 438/119 |
| 6,114,413 A | 9/2000 | Kang et al. | .............. 523/210 |
| 6,127,724 A * | 10/2000 | DiStefano | .............. 257/675 |
| 6,617,683 B2 | 9/2003 | Lebonheur et al. | ........ 257/707 |
| 6,709,895 B1 | 3/2004 | Distefano | ............... 438/115 |
| 6,972,495 B2 * | 12/2005 | Fjelstad | ................. 257/778 |
| 7,078,109 B2 | 7/2006 | Hill et al. | ................ 428/620 |
| 2003/0224186 A1 * | 12/2003 | Feng et al. | ............... 428/447 |
| 2004/0095727 A1 | 5/2004 | Houle | ................... 361/704 |
| 2005/0068741 A1 | 3/2005 | Bailey et al. | ............. 361/719 |
| 2005/0121758 A1 * | 6/2005 | Di Stefano | ............... 257/678 |
| 2005/0127500 A1 | 6/2005 | Colgan et al. | ............. 257/706 |

* cited by examiner

*Primary Examiner*—Bradley K Smith
*Assistant Examiner*—Marvin Payen
(74) *Attorney, Agent, or Firm*—Michael B. Einschlag (57) ABSTRACT

One embodiment of the present invention is a compliant thermal contactor that includes a resilient metal film having a plurality of first thermally conductive, compliant posts disposed in an array on a top side thereof and a plurality of second thermally conductive, compliant posts disposed in an array on a bottom side thereof.

16 Claims, 5 Drawing Sheets

COMPLIANT THERMAL CONTACTOR

This patent application is a continuation-in-part of a U.S. patent application Ser. No. 11/805,466 that was filed on May 22, 2007, which U.S. patent application is incorporated herein in its entirety.

TECHNICAL FIELD OF THE INVENTION

One or more embodiments of the present invention relate to method and apparatus for thermally contacting a heat source such as, for example and without limitation, an integrated circuit ("IC") package or a substrate to a heat dissipater such as, for example and without limitation, a heat spreader or a heat sink.

BACKGROUND OF THE INVENTION

Heat spreaders are commonly used in the integrated circuit ("IC") packaging/assembly industry to dissipate heat generated by high power (for example, >100 W) ICs (ICs are also referred to as chips). Typically, a heat spreader is attached to a back of a chip or an IC package using different types of thermally conductive materials. Such thermally conductive materials are typically provided in a sheet form that has thin adhesive layers on both sides of a pad—the adhesive layers are used to bond the pad (on a first side) to a heat spreader and (on a second side) to a chip or IC package.

The prior art discloses thermally, and non-thermally, conductive elastomeric posts being used in IC packaging applications. In such applications, to create an IC package: (a) posts are formed on a surface of a flexible or a rigid substrate interposer such as a printed circuit board; (b) the posts are then permanently bonded to a chip; (c) the chip is then electrically interconnected to the interposer using standard wire bonding or other interconnect methods; and (d) a dielectric material is then dispensed or injected between the posts to fill voids between the posts.

The prior art also discloses the use of a thermally conductive material, in sheet form, having a series of groves or channels on a first and/or a second surface, which groves or channels are created, for example, by embossing. The groves or channels are disclosed to provide a means for removing air during a bonding process wherein a chip is bonded to the first surface of the thermally conductive material, and a heat sink or a heat spreader is bonded to the second surface.

Thermally conductive pads disclosed in the prior art typically comprise a low modulus material, for example, silicone, that is soft and compliant but which is relatively incompressible—as indicated by a Poisson's ratio of 0.49-0.50. As a result, such thermally conductive silicone pads, with or without embossing, require a high pressure (for example, a pressure between 40 and 50 psi) to bring a heat source and a heat dissipater into intimate contact over a full area of their interface. Such a high pressure is required to distort the silicone pad laterally by an amount sufficient to fill voids at interfaces between: (a) the pad and a surface of the heat source; and (b) the pad and a surface of the heat dissipater. In addition to the use of high pressure to provide intimate contact, the thickness of the low modulus material must be relatively large to enable it to distort laterally to fill voids at the interfaces. However, a large pad thickness is problematic to providing good thermal conductivity. In addition, a problem exists whenever prior art thermally conductive silicone pads are used in device testing applications calling for releasable thermal contactors because prior art contactors have been known to leave residues after high temperature operation of chips.

In light of the above, there is a need in the art for method and apparatus that solves one or more of the above-identified problems.

SUMMARY OF THE INVENTION

One or more embodiments of the present invention satisfy one or more of the above-identified needs. In particular, one embodiment of the present invention is compliant thermal contactor that comprises a resilient metal film having a plurality of first thermally conductive, compliant posts disposed in an array on a top side thereof and a plurality of second thermally conductive, compliant posts disposed in an array on a bottom side thereof.

DETAILED DESCRIPTION

Figure 1A:
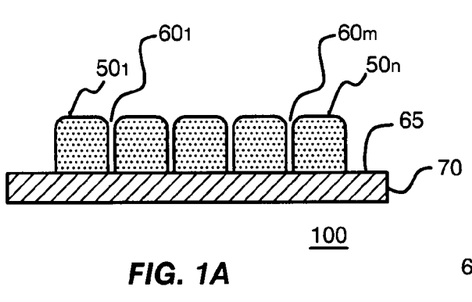
FIGS. 1A-1B show a vertical cross section and a top view, respectively, of a portion of a compliant thermal contactor which includes thermally conductive, compliant posts that are attached to a surface of a carrier, which compliant thermal contactor is fabricated in accordance with one or more embodiments of the present invention.
Figure 1B:
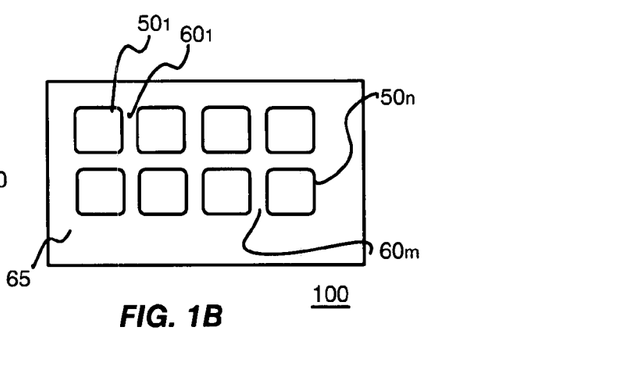

FIG. 1A shows a vertical cross section of a portion of compliant thermal contactor 100 which includes thermally conductive, compliant post structures $50_1$-$50_n$ (also referred to as posts $50_1$-$50_n$) that are attached to surface 65 of carrier 70 (compliant thermal contactor 100 is fabricated in accordance with one or more embodiments of the present invention). As used herein, the term compliant refers to mechanically compliant. FIG. 1B shows a top view of the portion of compliant thermal contactor 100 where it can be seen that posts $50_1$-$50_n$ are substantially square posts disposed in an array. In accordance with one or more such embodiments, spaces $60_1$-$60_m$ between posts $50_1$-$50_n$ allow for vertical compression of posts $50_1$-$50_n$ by providing space for lateral expansion of the girth of the posts, i.e., the spaces accommodate material displaced in a lateral direction by vertical compression of the posts. In accordance with one or more such embodiments, spaces $60_1$-$60_m$ are empty (i.e., at vacuum) or they may be filled with a gas (for example and without limitation, air, nitrogen, and so forth), or a liquid or other fluid that allows lateral expansion of posts $50_1$-$50_n$, i.e., flow of the fluid accommodates lateral expansion of the posts.

Figures 1C, 2A:
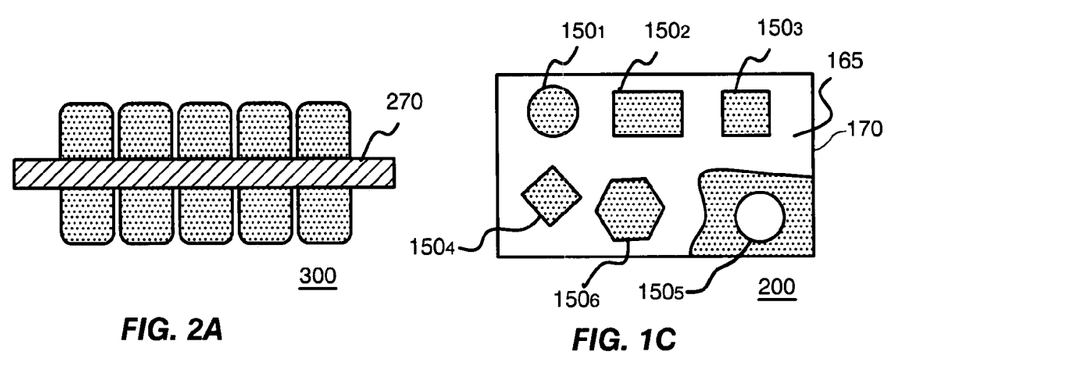
FIG. 1C shows a top view of a horizontal cross section of a portion of a compliant thermal contactor which includes thermally conductive, compliant posts that are attached to a surface of a carrier, which compliant thermal contactor is fabricated in accordance with one or more embodiments of the present invention.
FIGS. 2A-2B show vertical cross sections of portions of compliant thermal contactors which include thermally conductive, compliant posts that are attached to surfaces on both sides of a carrier, which compliant thermal contactors are fabricated in accordance with one or more embodiments of the present invention.

FIG. 1C shows a top view of a horizontal cross section of a portion of compliant thermal contactor 200 which includes thermally conductive, compliant post structures $150_1$-$150_6$ (also referred to as posts $150_1$-$150_6$) of various shapes that are attached to surface 165 of carrier 170 (compliant thermal contactor 200 is fabricated in accordance with one or more embodiments of the present invention). As shown in FIG. 1C, post $150_1$ has a circular cross section; post $150_2$ has a rectangular cross section; post $150_3$ has a square cross section; post $150_4$ has a diamond cross section; post $150_5$ has a cylindrical hole; and post $150_6$ has a hexagonal cross section. Although FIG. 1C shows posts having various shapes to illustrate various embodiments, in practice, one might utilize posts having one or a few shapes, for example and without limitation, one or more of the shapes shown in FIG. 1C.

In accordance with one or more embodiments of the present invention, posts $50_1$-$50_n$ or posts $150_1$-$150_n$ may be constructed of a compliant material such as a filled polymeric elastomer or a soft metal. For example and without limitation, the polymeric matrix material of the filled elastomer may be a silicone, a fluorocarbon elastomer, a flexible epoxy, a flexible polyimide, a polyurethane, a rubber material combinations of one or more of the foregoing, and so forth. The hardness of the elastomer is preferably between about Shore A20 and Shore A90. Alternatively, the compliant material may be a soft metal such as, for example and without limitation, indium, an indium alloy, Woods metal, a bismuth alloy, Babbett metal, a lead alloy, a tin alloy, and Indalloy materials (available from Indium Corporation of America, Utica, N.Y.), Kapp AgSn (available from Kapp Alloy and Wire, Inc., Oil City, Pa.), combinations of one or more of the foregoing, and other soft metals.

In addition, and in accordance with one or more such embodiments of the present invention, the compliant material may be formulated so that its thermal conductivity (W/m-° C.) is greater than about 0.5 W/m-° C. To do this, commonly used high thermal conductivity filler particles such as, for example and without limitation, silver (Ag), Ag flakes, aluminum (Al) particles, aluminum fibers, aluminum flakes, silica, carbon fibers, carbon nanotubes, nanosprings, aluminum nitride ($Al_2N_3$), alumina ($Al_2O_3$,), copper (Cu), tin (Sn), boron nitride, tungsten carbide, hollow spheres, combinations of one or more of the foregoing, and so forth are blended, for example and without limitation, with a resin matrix (for example, a polymeric material). As is well known, the thermal conductivity of the resulting material is a function of filler loading, particle size distribution, and dielectric spacing between the thermally conductive filler particles. Any one of a number of blending techniques that are well known to those of ordinary skill in the art may be used to disperse the filler particles in the resin matrix, and, as a result, to provide a desired thermal conductivity. Suitable blending techniques include, for example and without limitation, high shear mixing, 3-roll milling, and so forth. In accordance with one or more embodiments of the present invention, different particle sizes and several of the above-identified fillers can be blended into the resin matrix.

In accordance with one or more embodiments of the present invention, compliant thermal contactor 100 can be fabricated utilizing stenciling to form posts directly on carrier 70. In accordance with one such method, holes are formed in a stencil that is fabricated, for example and without limitation, from a metal alloy (for example and without limitation, stainless steel, molybdenum alloy steel, and so forth) or a plastic where the stencil has: (a) a thickness equal to a height of the posts; (b) holes with diameters (or cross-sectional configurations) equal to those of the posts; and (c) a number of holes per unit area to provide a desired density of posts. Next, the stencil is aligned on surface 65 of carrier 70 using pin/alignment or any other alignment technique that is well known to those of ordinary skill in the art. Next, the material is printed into the holes using conventional stenciling machines, or manually. Next, if the material is viscous or thixotropic enough, the stencil is lifted off, and the material is cured or partially cured by heating or exposing it to ultraviolet light or a combination thereof, such as by exposing the material to ultraviolet light to create a "skin" of cured material and then curing or partially curing the material by a heating step in an oven to provide good bonds to carrier 70. The stencil may also be removed after the curing step. In this case, the material will conform to the shape of the holes in the stencil as it begins to cure. Thus, for compliant thermal contactor 100, the posts will be square in shape with substantially flat top surfaces. If the stencil is left atop carrier 70 during the curing step, the posts may partially adhere to the stencil at an exposed top edge of each hole on a first surface of the stencil as the material cures. This makes removal of the stencil, while maintaining the integrity of the posts, difficult. One solution to this problem is to use a stencil where each hole in the stencil has a smaller top edge circumference at a top surface of the stencil than at a bottom surface of the stencil. The smaller circumference of each hole reduces the strength of attachment of the compliant posts to the stencil. However, because of the shape of the enclosure, the liquid material typically must be screened across the top surface of the stencil in two directions to ensure the enclosure is completely filled. The material will then take on a square shape corresponding to the shape of the enclosure, and will retain its shape after curing. Another solution to this problem is to coat the stencil with a material that resists adherence of the material as it cures. In addition posts could be formed by other methods known in the field such as and not limited to laser cutting, sawing, knife cutting, casting, and so forth. In this case, a continuous film of the thermally conductive material is attached to surface 65 of carrier 70 by any one of a number of methods that are well known to those of ordinary skill in the art such as, for example and without limitation, screen-printing, stenciling, lamination, and so forth. This material is then fully cured, and the posts can be created by using lasing, sawing, knife cutting, and so forth at a cutting width, for example and without limitation, in a range from about 2 to about 10 mils.

In accordance with one or more further embodiments of the present invention, the posts may further include an adhesive for use, for example and without limitation, in connecting the posts to a chip or a heat spreader or a heat sink. For example and without limitation, the adhesive can be made of the same material as the base material (where such an adhesive is semi-cured (B-staged)), or the adhesive can be a silicone pressure sensitive adhesive disposed on top of the posts. The adhesive may be applied to the posts by stenciling—for example, using a thicker stencil than the one used to form the posts. Alternatively, the posts could be fabricated so that a thin sheet of material containing the posts is disposed on top of the posts, and then the thin sheet and posts would be bonded to the chip.

In accordance with one or more embodiments of the present invention, carrier 70 may be of any thickness that provides a desired thermal conductivity in a particular application. In addition, and in accordance with one or more embodiments of the present invention, carrier 70 may be, for example and without limitation, silicon, Cu or Cu alloys, Al, carbon fiber, carbon fiber fabric, carbon nanotube substrates, glass reinforced substrates, reinforced plastic (for example, glass reinforced to change physical, mechanical properties), non-reinforced plastic, ceramic, one or more layers of one or more of the foregoing, and so forth.

In accordance with one or more embodiments of the present invention, compliant thermal contactor 100 or compliant thermal contactor 200 may be used to thermally interconnect two components (for example and without limitation, an IC package to a heat sink, a MEMS ceramic package to a heat spreader, and so forth) using a predetermined amount of pressure. With respect to compliant thermal contactor 100, in response to a pressure having a component along a direction perpendicular to surface 65 of carrier 70 (i.e., a Z direction), compliant posts $50_1$-$50_n$ will contract along the Z direction, and will expand in girth (i.e., in planes perpendicular to the Z direction). This expansion will reduce the space between posts, and as a result, will help to achieve better heat transfer (depending on the material and the configuration of the posts, such expansion can result in creating a void free interface between the surface of carrier 70 and a surface of one of the components).

In accordance with one or more embodiments of the present invention, the geometry of a post may have any one of a variety of shapes such as, for example and without limitation, any one of those shown in FIG. 1C. In addition, and in accordance with one or more embodiments of the present invention, a compliant thermal contactor many comprise posts having different geometries. Note that post $150_5$ has a cylindrical hole which helps minimize the amount of pressure needed to move the post in the Z direction. Lastly, in accordance with one or more embodiments of the present invention, an edge profile of a vertical cross section of a post may have any one of a variety of shapes such as, for example and without limitation, a straight line that is perpendicular to the surface of the carrier, a straight line that is inclined at an angle to the surface of the carrier, or a curve of arbitrary shape. In accordance with one or more embodiments of the present invention, the posts may be of any height, cross sectional area, and density that provides a desired thermal conductivity in a particular application such as, for example and without limitation, a height in a range from about 0.050 mm to about 0.750 mm, a measure of cross sectional area such as a diameter or other lateral dimension (as measured, for example, at its juncture with the carrier) in a range from about 0.25 mm to about 1.50 mm, and a density of posts in a range from about 5 to about 100 posts/square centimeter—or in terms of center-to-center distance or "pitch" in a range from about 0.5 to about 2 mm.

Although FIG. 1A shows posts $50_1$-$50_n$ being individual posts that are formed on carrier 70, further embodiments of the present invention exist wherein a thermally compliant underlayer is formed on carrier 70 where, for example and without limitation, the thermally compliant layer is formed of the same material as that used to form posts $50_1$-$50_n$. Thus, in accordance with such further embodiments, instead of being separated from one another as is the case for compliant thermal contactor 100 shown in FIG. 1B, thermally compliant material forming posts $50_1$-$50_n$ (or other thermally compliant material) exists between the posts (to provide an underlayer to portions of the posts above the underlayer). In accordance with one or more such embodiments, the matters discussed herein regarding aspect ratio and so forth apply here as well to portions of the posts above the underlayer. Again, the posts and any underlayer may each be of any height that provides a desired thermal conductivity in a particular application.

In accordance with one or more further embodiments of the present invention, the thermally conductive material includes: (a) a polymeric material that is a pressure sensitive adhesive, such as, for example and without limitation, an acrylic or a silicone pressure sensitive adhesive; and (b) a thermally conductive filler. The pressure sensitive, thermally conductive material allows for bonding directly to adjacent surfaces of a chip or heat spreader or heat sink. In accordance with one or more such embodiments, the polymeric material may be, for example and without limitation, an acrylic resin, a silicone rubber, a fluorosilicone rubber, a polyurethane, and so forth. Such polymeric materials are well-known and commercially available. Suitable thermally conductive fillers are particulate solids capable of providing the material with a desired thermal conductivity such as, for example and without limitation, aluminum, aluminum oxide, aluminum nitride, boron nitride, magnesium oxide, silicon carbide, zinc oxide, silver, gold, copper, or metal coated materials, such as, for example and without limitation, silver coated glass, silver coated copper or silver coated aluminum, combinations of one or more of the foregoing, and so forth. The particles should be of a sufficiently small size as to not distort the surface of the thermally conductive material such as, for example and without limitation, sizes in a range from about 1 micron to about 50 microns. The fillers are included in the material in an amount sufficient to provide a desired thermal conductivity. For example, and without limitation, the fillers may be included in an amount in a range from about 10% by weight to about 85% by weight of the finished material. Additional ingredients may also be added so long as they do not significantly degrade the conformability or thermal conductivity of the material. For example, a solvent may be used when compounding the material to make mixing and fabrication easier. A mechanical carrier material may be added such that it does not interfere significantly with the thermal conductivity of the thermally conductive material. Suitable carrier materials include, for example and without limitation, glass fiber, mesh or cloth, plastic fiber, mesh cloth or films or metal fiber, mesh, cloth or foils (the glass cloth may be woven or unwoven, and the plastic carrier material may be a mesh material, or a film, and if a film, it may be solid or foraminous). Suitable plastics include, for example and without limitation, nylons, polyesters, polyamides, polyimides, polyethylenes, PEEK, and so forth. Well-known useful plastic films are, for example and without limitation, MYLAR® polyester films and KAPTON® polyimide films. As plastic films generally exhibit poor thermal conductivity properties, one may use a film which contains a thermally conductive filler—one such filler film is KAPTON MT®, a polyimide film which contains either an aluminum oxide or boron nitride filler. Alternatively, one may use a very thin film layer or apertures in the film so as to minimize its effect on the thermal transfer. Suitable metals, useful as a mesh cloth or a foil, include, for example and without limitation, aluminum, copper, silver, iron, tinned copper, and so forth. In molding the thermally conductive material, components are mixed with a solvent and poured into a prefabricated mold. One may coat the inside of the mold with a release coating before adding the components. The mold is then heated or otherwise subjected to an external energy field to form the molded shape. Instead of using a separate mold, it may be desired to use a mold which allows the heat conductive material to be molded in place directly to one of the surfaces it will contact. As the material is adhesive, the outer surfaces are covered by a release layer such as a coated paper, foil or a plastic film. Alternatively, the material of the mold may be, for example, aluminum which may be dissolved after cure of the adhesive by immersion in a caustic bath.

A process for fabricating a thermally conductive electronic assembly is particularly useful in forming an acrylic based, pressure sensitive post: (a) a heat source such as a semiconductor is placed against a holding means; (b) a compliant thermal contactor has a first major surface placed upon and bonded to an exposed surface of the heat source; and (c) a heat sink is placed upon and bonded to a second major surface of the compliant thermal contactor. An assembly holder is used to maintain the assembly in position and pressure is applied by the assembly holder through a pressure means to move the various components together. The assembly may then be removed from the assembly holder. The pressure applied may be positive or negative (i.e. a vacuum). Alternatively, a semiconductor chip is abutted to the compliant posts. Next, the compliant thermal contactor and the chip are squeezed together between a first platen and a second platen—the platens are urged toward one another by a press. During this step, the posts are compressed. The extent of such compression may vary from post to post, depending upon the original height of each post. Because the posts can accommodate height variations in this manner, the heights of the posts prior to compression need not be precisely uniform. The top of each post may be made tacky by providing an adhesive, a silicone gel, or a film of uncured silicone elastomer thereon so that the chip adheres thereto. Similarly, the chip surface may be coated with an adhesive so that the tips of the posts engage such adhesive.

As one can readily appreciate from the above, one or more embodiments of the present invention provide a compliant thermal contactor useful to provide a thermal connection between, for example and without limitation, an integrated circuit ("IC") package or substrate and, for example and without limitation, a heat spreader or a heat sink. In accordance with one or more such embodiments, the compliant thermal contactor includes individual post structures (also referred to as posts) formed on a surface of a carrier. In particular, the posts are compliant, have a predetermined height, and have a predetermined amount of space between them so that a pressure applied to the posts having a component along the Z direction (i.e., a direction perpendicular to the surface of the carrier) results in a predetermined resilient reduction in height (referred to herein as compliancy in the Z direction), and a predetermined expansion in cross section (taken in planes perpendicular to the Z direction) at predetermined locations along the vertical extent of the posts. Advantageously, in accordance with one or more such embodiments, movement of the posts in the Z direction helps displace fluid such as, for example and without limitation, air, disposed between the posts, and the expansion in cross section enables sides of the posts to touch to provide improved thermal conductivity. In addition, and advantageously, compliancy in the Z direction assists in reducing effects of any non-planarity that might exist between the compliant thermal contactor and a structure to which it is abutted. Further, since a contact area of each post (a cross section of a top of a post) is small (to a predetermined degree); the amount of pressure required to make effective thermal connection between the compliant thermal contactor and a structure to which it is abutted is reduced. One effect of the compliant thermal contactor is to distribute attachment forces applied thereto over a surface of, for example and without limitation, a chip to achieve low stress levels without local stress concentrations on the chip. Another advantage of the one or more embodiments of the invention occurs when the compliant thermal contactor absorbs most of any applied stress within its own structure, and transmits only a small fraction of the applied stress to the chip. This is because each discrete post in the compliant thermal contactor can deflect or distort independently of the others, and because the shape and density of the posts can be selected for optimum values of shear, tensile and compressive strengths. For example, when the ambient temperature increases, and the chip expands, the posts individually adjust to match the differential expansion. As discussed above, the mechanical properties of the compliant thermal contactor depend on the material used to form the posts, the geometry (shape) of the individual posts, the spatial density of the posts, and on the carrier. In general, the stiffness of the compliant thermal contactor can be increased by utilizing a material with a higher elastic modulus, posts with a smaller length-to-cross-section-area ratio; and/or a greater post density. Conversely, the mounting stiffness can be decreased by a lower elastic modulus; longer or slimmer posts; and/or more separation between posts. The geometry of the posts is believed to have the greatest effect on the mechanical properties of the compliant thermal contactor. For example, if the posts are essentially of infinite diameter, i.e., a continuous sheet of material, the compliant thermal contactor would not achieve the desired low-stress. In a continuous sheet, the materials exhibit high thermal expansion, and very low compressibility. It is only in an array of separate posts that the necessary flexibility in shear and compressive characteristics can be achieved. Generally, the post array of the compliant thermal contactor can be made progressively softer and more compliant in both compression and shear by increasing the ratio of post length to post diameter. With a given length-to-diameter ratio of posts, the actual magnitudes of shear and compressive strengths can be adjusted by changing the density of the posts in the array.

In accordance with one or more embodiments of the present invention, compliancy in the Z direction is a function of: (a) an aspect ratio of a measure of cross sectional area of a post (for example, the measure may be taken as a post diameter for a cylindrical post or the measure may be taken as a maximum lateral dimension of a post) to a measure of post height; and (b) resilience of the post material. In accordance with one or more embodiments of the present invention, the aspect ratio is in a range from about 1:1 to about 20:1. In addition, space between the posts when the compliant thermal contactor is actuated is a function of: (a) movement of the posts in X and Y directions (i.e., in planes perpendicular to the Z direction) when pressure is applied to them along the Z direction; and (b) the aspect ratio. In accordance with one or more embodiments of the present invention, 2 mm square posts of thermally conductive elastomer are disposed in an array spaced apart by a spacing of about 0.24 mm. During operation, the thermal contactor of the embodiment is urged by a pressure of 10 Newtons/cm$^2$ downward against a top surface of an IC, making thermal contact thereto. The posts are compressed in the Z direction by about 20% under a pressure of 10 Newtons/cm$^2$, thereby expanding laterally in each of the X and the Y directions. Lateral expansion of each post is unimpeded by interference with adjacent posts because of the spacing of 0.24 mm therebetween. Preferably, the percentage of the total volume of the array that is occupied by thermal posts is in a range from about 50% to about 95% to allow vertical deflection of posts in the array. For this calculation, the total volume of the array includes the posts and the space between the posts.

Advantageously, because the pressure required to provide good thermal contact between the compliant thermal contactor and an IC, a heat spreader, or a heat sink is less that needed for thermal contactors of the prior art, the thickness of the compliant thermal contactor can be reduced and, thereby, provide increased thermal conductivity. In addition, for applications where the compliant thermal contactor is intended to be released from the IC or heat spreader or heat sink after use, for example, in applications involving testing electronic devices for functionality or reliability, a resilient layer of thermally conductive material on the top of the post may be used to enhance its thermal properties. A covering layer such as, for example and without limitation, a layer of thermally conductive material such as gold, silver, copper, platinum, palladium, nickel, aluminum, alloys thereof, combinations of one or more of the foregoing, and so forth may be disposed over the posts to prevent contaminants from oozing out of the compliant material of the thermal contactor.

Figure 2B:
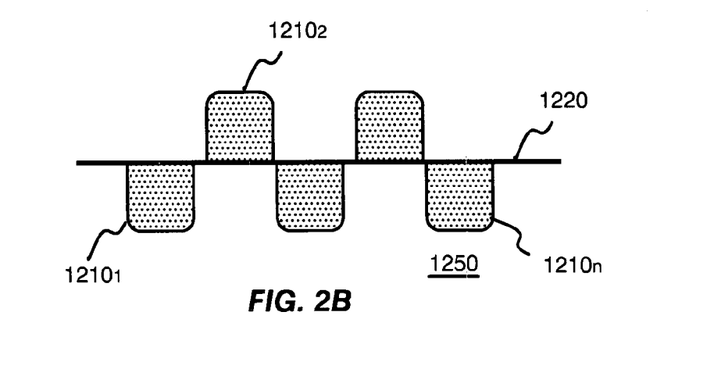

FIGS. 2A and 2B show vertical cross sections of portions of compliant thermal contactors 300 and 1250, respectively, which include thermally conductive, compliant posts that are attached to both sides of carriers 270 and 1220, respectively (compliant thermal contactors 300 and 1250 are fabricated in accordance with one or more embodiments of the present invention). In accordance with one or more such embodiments, posts are printed on one side of carrier 270 (refer to FIG. 2A) in accordance with one or more suitable methods described herein. Next, the posts are fully or partially cured. Next, carrier 270 is flipped over, and posts are printed on the other side in accordance with one or more suitable methods described herein. Next, the posts are fully or partially cured. If one or more such embodiments further include an adhesive being disposed on top of the posts, such an adhesive can be applied to posts disposed on one side of carrier 270 in accordance with one or more suitable methods described herein, and a release film such as Tedlar® film or Teflon® made by DuPont (www.dupont.com) can be applied over the adhesive in the same manner that is used to apply the adhesive. Next, carrier 270 is flipped over, and the same procedure is followed on the other side. Finally, the release film may be removed. In accordance with one or more such embodiments, carrier 270 may be formed of the same materials used to form carrier 70 described above.

As shown in FIG. 2B, compliant thermal contactor 1250 is fabricated in accordance with one or more further embodiments of the present invention wherein post structures $1210_1$-$1210_n$ are disposed on both sides of thermally conductive carrier 1220. In accordance with one or more such embodiments, thermally conductive carrier 1220 is a resilient thin layer (i.e., having a thickness in a range between about 0.020 mm to about 0.100 mm). Thermally conductive carrier is 1220 is typically a metal or metal alloy such as, for example and without limitation, Cu, Al, alloys of the foregoing, and so forth. Thermally conductive carrier 1220 may also be in the form of a wire mesh, metal screen, or metal wool. Alternatively, thermally conductive carrier 1220 can be a reinforced or filled dielectric material such as epoxy, polyimide, silicone, cyanate ester, and so forth having good heat transfer characteristics exemplified by a thermal conductivity of >0.5 W/m-° C. As shown in FIG. 2B, the post structures may not be aligned vertically, but rather may be staggered. Such an arrangement provides better compliancy, and therefore, requires less pressure when it is used to couple thermally any two elements such as a heat source and a heat dissipater together.

Figure 3A:
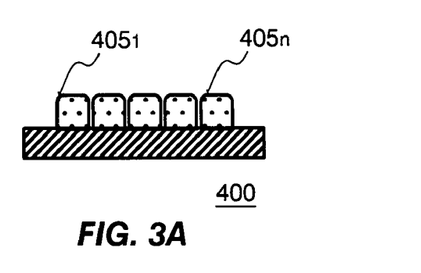
FIGS. 3A-3B show vertical cross sections of portions of compliant thermal contactors that are fabricated in accordance with one or more further embodiments of the present invention.
Figure 3B:
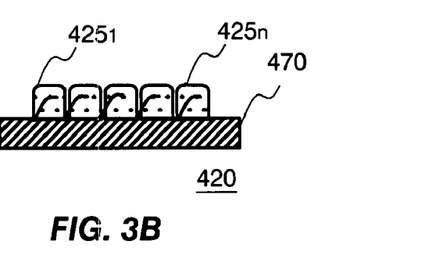

FIGS. 3A-3B show vertical cross sections of portions of compliant thermal contactors 400 and 420, respectively, which are fabricated in accordance with one or more further embodiments of the present invention. In particular, FIG. 3A shows a vertical cross section of a portion of compliant thermal contactor 400 wherein a top surface of thermally conductive posts $405_1$-$405_n$ has been etched to expose conductive particles. Advantageously, such an embodiment is useful in applications where a top side of the posts does not need to be attached to another carrier, but instead, is released therefrom after use. In such applications, because the conductive particles are in contact with another carrier, it is believed that the release force would be lower than if such particles were not exposed. Suitable methods for etching the top surface of the posts are well known to those of ordinary skill in the art and include, for example and without limitation, chemical etching, plasma etching, lasing, polishing, and so forth. Alternatively, metallic particles having a size in a range from about 0.1 to about 10 microns can be placed on top of the posts during the post formation process. Once the posts are formed, they can be partially cured with or without the stencil mask in place. The metallic particles are then placed on top of all the posts by different methods such as, for example and without limitation, spraying, stenciling, and so forth. Once the particles are in place, the material of the posts may be fully cured.

FIG. 3B shows a vertical cross section of a portion of compliant thermal contactor 420 wherein thermally conductive posts $425_1$-$425_n$ include resilient structures, for example and without limitation, metal structures, disposed within the posts. In accordance with one or more such embodiments, the embedded resilient structures act as springs. In accordance with one or more such embodiments, the metal structures can be made of a metal or a metal alloy such as, for example and without limitation, Monel, Ni/Pd, Ni/Co, Ni/Ti, Be/Cu, copper alloys, and so forth. In addition, and in accordance with one or more such embodiments, the metal may be deposited selectively using photolithographic means that are well known to those of ordinary skill in the art: (a) on carrier 470 where carrier 470 is a metal, or (b) on a metal layer that is deposited on carrier 470. Next, material under the deposited metal is etched to undercut it using, for example and without limitation, any one of a number of etching techniques that are well known to those of ordinary skill in the art such as isotropic etching. As a result, the metal that is undercut curls upward.

In accordance with one or more embodiments of the present invention, a compliant thermal contactor is fabricated using a pre-form similar to an ice cube tray. In accordance with one or more such embodiments, the pre-form can be made out of metal or plastic with a release layer disposed on the inside so that the posts can be released therefrom. The release layer may be, for example and without limitation, Teflon®, any one or a number of mold release compounds such as Frekote-1711 made by Henkel of Madison Heights, Mich., and so forth. In accordance with one or more such embodiments, the material used to form the posts is placed into the tray using any one of a number of methods that are well known to those of ordinary skill in the art such as, for example and without limitation, stenciling or dispensing methods. Next, the posts are fully or partially cured, and an adhesive may be formed over all the posts (if they are fully cured) using any one of a number of methods that are well known to those of ordinary skill in the art such as, for example and without limitation, stenciling or dispensing methods. The adhesive layer is used to attach the posts to a carrier using any one of a number of methods that are well known to those of ordinary skill in the art such as, for example and without limitation, pin/alignment. If the posts are partially cured, the carrier is aligned, and the posts are then fully cured.

In accordance with one or more embodiments of the present invention, a compliant thermal contactor is fabricated using a first pre-form similar to an ice cube tray wherein a polymeric pre-form (into which the material used to form the posts will be placed) is disposed inside the first pre-form. In accordance with one or more such embodiments, the material is placed into the polymeric pre-form using any one of a number of methods that are well known to those of ordinary skill in the art such as, for example and without limitation, stenciling or dispensing methods. Next, the posts are fully cured. Next, a thinner stencil is placed over the posts using pin/alignment, and an adhesive is printed over the posts using any suitable method described herein. Next, the pre-forms are flipped over and pin/aligned to a carrier. Next, pressure is applied so that the posts stick to a surface of the carrier. Finally, the pre-forms are removed. The first pre-form may also be removed using methods such as, for example and without limitation, etching, melting, dissolving, and so forth.

Figure 4A:
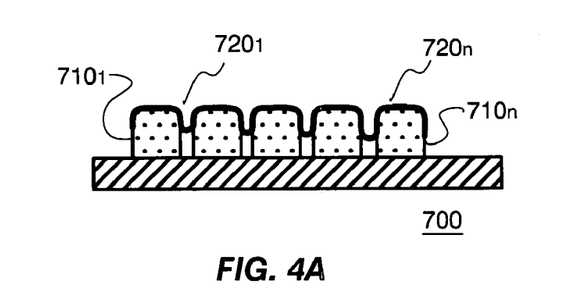
FIG. 4A shows a vertical cross section of a portion of a compliant thermal contactor which includes thermally conductive, compliant posts having a thermally conductive layer disposed thereon, which compliant thermal contactor is fabricated in accordance with one or more embodiments of the present invention.

FIG. 4A shows a vertical cross section of a portion of compliant thermal contactor 700 which includes thermally conductive, compliant posts $710_1$-$710_n$ having layers $720_1$-$720_n$ (also referred to as films $720_1$-$720_n$) disposed thereon (compliant thermal contactor 700 is fabricated in accordance with one or more embodiments of the present invention). Compliant posts $710_1$-$710_n$ may be particle filled elastomeric materials, soft metal alloys, metal-elastomeric composite materials, and other compliant structures, wherein the materials forming the posts have a thermal conductivity of about 0.1 W/m-° C. or greater. In accordance with one or more embodiments of the present invention, layers $720_1$-$720_n$ act as a resilient thermal spreader and release layer when posts $710_1$-$710_n$ are compressed to make contact with another surface. In addition, layers $720_1$-$720_n$ enable thermal spreading along a top surface of posts $710_1$-$710_n$. Layers $720_1$-$720_n$ may comprise a thin layer of a material having a thickness in a range between about 0.001 mm to about 0.05 mm. In accordance with one or more such embodiments, layers $720_1$-$720_n$ can be, for example and without limitation: (a) a metal or a metal alloy such as, for example and without limitation, copper, silver, gold, nickel, palladium, alloys thereof, and so forth, which can be deposited using any one of a number of methods that are well known to those of ordinary skill in the art such as, for example and without limitation, lamination, sputtering, plating, and so forth; or (b) any one of a number of a dielectric materials that have non-stick characteristics such as, for example and without limitation, Teflon® (which can be applied using any one of a number of methods that are well known to those of ordinary skill in the art such as, for example and without limitation, spraying), a reinforced thermoplastic, a non-reinforced thermoplastic, an epoxy, or a composite of any of the foregoing. In accordance with one or more such embodiments, layers $720_1$-$720_n$ may be individual layers disposed on top of each post, or in accordance with one or more further embodiments, layers $720_1$-$720_n$ may be part of a continuous sheet that is affixed to, and encloses a portion of, the posts. Further, in accordance with one or more such embodiments wherein layers $720_1$-$720_n$ are part of a continuous sheet, the continuous sheet would be affixed to, and enclose a portion of, the posts, for example and without limitation, at recesses in the sheet, which recesses may be formed using any one or a number of methods that are well known to those of ordinary skill in the art such as, for example and without limitation, embossing. According to one or more embodiments, layers $720_1$-$720_n$ comprise resilient metal foils of metals preferably selected from the group including Monel, nickel, coin silver, copper alloys, beryllium copper alloys, and resilient metals with thermal conductivity of at least 0.1 W/m-° C.

Figure 4B:
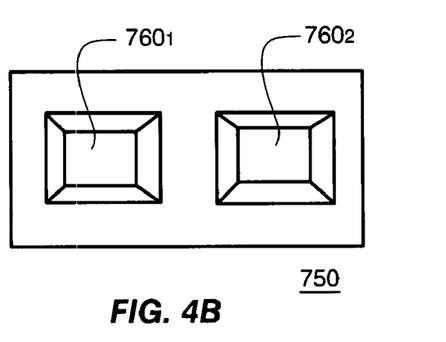
FIG. 4B shows a top view of a portion of a compliant thermal contactor which includes thermally conductive, compliant posts having a thermally conductive layer disposed thereon, which compliant thermal contactor is fabricated in accordance with one or more embodiments of the present invention.

FIG. 4B shows a top view of compliant thermal contactor 750 which includes thermally conductive, compliant posts $760_1$-$760_n$ wherein compliant thermal contactor 750 is fabricated in accordance with one or more embodiments of the present invention. As shown in FIG. 4B, a preformed sheet metal structure having embossed cavities (whose function is to hold individual posts in place) is disposed over, and is affixed to, posts $760_1$-$760_n$. This sheet structure can be made using any one of a number of methods that are well known to those of ordinary skill in the art such as, for example and without limitation, plating, drawing, and so forth. The thin sheet structure can be, for example, and without limitation a) a thin (i.e., having a thickness in a range from about 0.005 to about 0.05 mm) metal or metal alloy such as, for example and without limitation, copper, silver, nickel, tin, and alloys thereof; or (b) a thin resilient dielectric material having a thermal conductivity of about 0.5 Watts/m-° C. The side walls of resilient thin metal surrounding the individual posts provide an additional amount of compliance and thermal conduction such that the individual posts can move vertically when a force is applied.

Figure 5A:
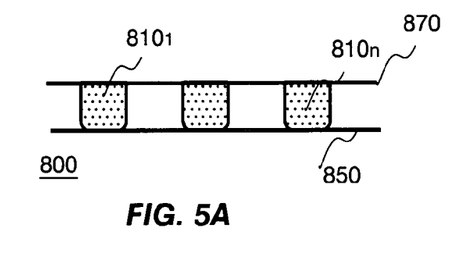
FIGS. 5A-5B show vertical cross sections of portions of compliant thermal contactors which include thermally conductive, compliant posts disposed between two carriers, which compliant thermal contactors are fabricated in accordance with one or more embodiments of the present invention.

FIG. 5A shows a vertical cross section of a portion of compliant thermal contactor 800 that is fabricated in accordance with one or more embodiments of the present invention. As shown in FIG. 5A, thermally conductive, compliant posts $810_1$-$810_n$ are disposed between thin resilient metal carriers 850 and 870, each having a thickness, for example and without limitation, in a range from about 0.001 to about 0.05 mm. Metal carriers 850 and 870 may be of the same or different thicknesses. In accordance with one or more such embodiments, metal carriers 850 and 870 may comprise the same or a different metal. The metal can be made of any high thermally conductive metal or metal alloy such as, for example and without limitation, Ag, Au, Cu, Al, and alloys of one or more of the foregoing. The metal can also be in the formed of meshed wire or metal wool. In accordance with one or more embodiments of the present invention, posts $810_1$-$810_n$ are formed on carrier 850 in accordance with one or more suitable methods described herein. Then, carrier 870 is placed over the posts before the posts are fully cured. Then, the posts are cured. In accordance with one or more embodiments of the present invention, metal carrier 850 may be perforated, patterned, or etched to increase its resilience.

Figure 5B:
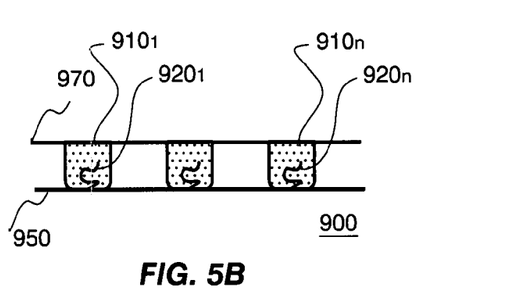

FIG. 5B shows a vertical cross section of a portion of compliant thermal contactor 900 that is fabricated in accordance with one or more embodiments of the present invention. As shown in FIG. 5B, thermally conductive, compliant posts $910_1$-$910_n$ are disposed between thin metal carrier 950 having a thickness, for example and without limitation, in a range from about 0.005 to about 0.05 mm and thin metal carrier 970 having a thickness, for example and without limitation, in a range from about 0.005 to about 0.05 mm. The metal carriers could be of the same or different thicknesses. In accordance with one or more such embodiments, metal carriers 950 and 970 may comprise the same or a different metal. The metal can be made of any thermally conductive metal or metal alloy such as, for example and without limitation, Ag, Au, Cu, Al, Ni, and alloys of one or more of the foregoing. The metal can also be in the formed of meshed wire or metal screen. In addition, as shown in FIG. 5B, each post includes a metal spring structure $920_n$ embedded within the compliant post.

To use compliant thermal contactor 800 or 900 between a heat source and a heat dissipater, a thermally conductive adhesive can be applied to an outer surface of each carrier to bond the compliant thermal contactor to the heat source and the heat dissipater. Adhesive materials such as silver filled silicone, BN filled silicone, silver filled epoxy, and filled organic adhesives may be used to attach the thermal contactor to a heat source or sink. Alternatively, a low melting point layer of an alloy such as, for example and without limitation, indium (for example, 19, 162, and so forth), Sn, Sn/Pb, and so forth can also be applied to the outer surface of the carriers. Then, bonding is carried out at temperatures above the melting point of the bonding material. Advantageously, in accordance with one or more such embodiments, a height of the posts can be in a range between about 0.05 to about 0.5 mm for better heat transfer.

Figure 6A:
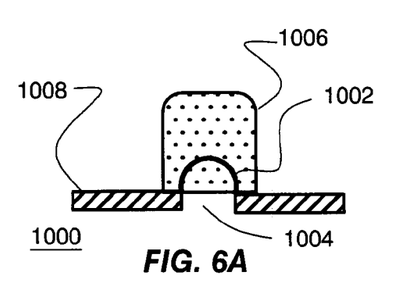
FIGS. 6A-6C show vertical cross sections of portions of compliant thermal contactors, which compliant thermal contactors are fabricated in accordance with one or more embodiments of the present invention.
Figure 6B:
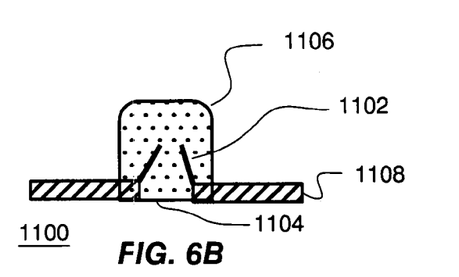
Figure 6C:
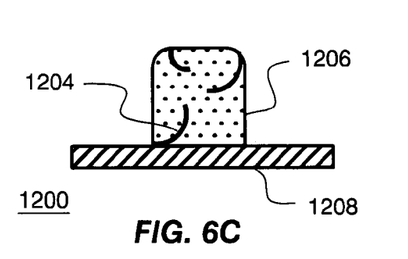
Figure 6D:
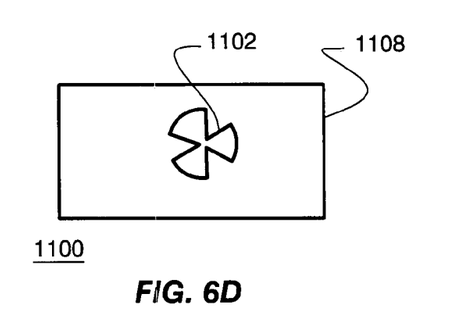
FIG. 6D shows a top view of the portion of the compliant thermal contactor shown in FIG. 6B.

FIGS. 6A-6C show vertical cross sections of portions of compliant thermal contactors 1000, 1100, and 1200, respectively, and FIG. 6D shows a top view of the portion of compliant thermal contactor 1100 shown in FIG. 6B (compliant thermal contactors 1000, 1100, and 1200 are fabricated in accordance with one or more embodiments of the present invention). As shown in FIGS. 6A-6C, the thermally conductive, compliant posts of compliant thermal contactors 1000, 1100, and 1200 include embedded metal structures that act as springs. In accordance with one or more embodiments of the present invention, the embedded metal structures may be formed from materials such as, for example and without limitation, Al, Ag, Cu, Ni, Au, alloys thereof, and so forth. In accordance with one or more embodiments of the present invention, the metal structures for compliant thermal contactors 1000 and 1100 are formed on a metal carrier 1008 or 1108 using any one of a number of methods that are well known to those of ordinary skill in the art such as, for example and without limitation, chemical or mechanical machining, embossing, and so forth. In particular, a 0.1 mm thick metal carrier has apertures (such as 1004 or 1104) formed therein (leaving thin sections over the apertures) using any one of a number of methods that are well known to those of ordinary skill in the art such as, for example and without limitation, chemical etching. Next, spring structures such as 1002 or 1102 are formed by mechanical embossing (FIG. 6A shows an embodiment wherein embossing has not broken through the thin section, and FIG. 6B (and FIG. 6D) shows an embodiment wherein embossing has broken through the thin section to form prongs). Metal carriers such as 1008 or 1108 can be formed of any high thermally conductive metal or metal alloy such as, for example and without limitation, Cu, Ni, Al, Be/Cu, alloys of the foregoing, and so forth. Next, thermally compliant posts such as 1002 or 1102 are formed over these structures in accordance with one or more suitable method described herein. In accordance with one or more such embodiments, the thermally compliant posts cover the spring structures, and in some cases, as shown in FIG. 6B, apertures 1104 on carrier 1108 are filled with the same material. In addition, and in accordance with one or more embodiments of the present invention, the metal structures of compliant thermal contactor 1200 (refer to FIG. 6C) may be formed on metal carrier 1208 by mixing metal structures 1204 into material used to form thermally compliant post 1206. Then, the thermally compliant posts are formed on the carrier in accordance with one or more suitable methods described herein. Advantageously, in accordance with one or more such embodiments, compliant thermal contactors 1000, 1100, and 1200 provide good compression and release properties for the posts during their use, for example and without limitation, in testing applications.

In accordance with one or more further embodiments of the present invention, various compliant thermal contactors are fabricated which utilize metal films of the types shown in FIGS. 4A-4B and 5A-5B with the structures shown in FIGS. 6A-6C.

Embodiments have been described above for connecting to a device or a device under test ("DUT") wherein the device or DUT is, for example and without limitation, a packaged integrated circuit ("IC") device or a die of a semiconductor wafer. However, it should be understood by those of ordinary skill in the art that a compliant thermal contactor may be used in a variety of different fields, applications, industries, and technologies. As such, one or more embodiments of the present invention can be used with any system in which temperature is either set and/or controlled. This includes many different processes and applications involved in semiconductor fabrication, testing, and operation.

Figure 7A:
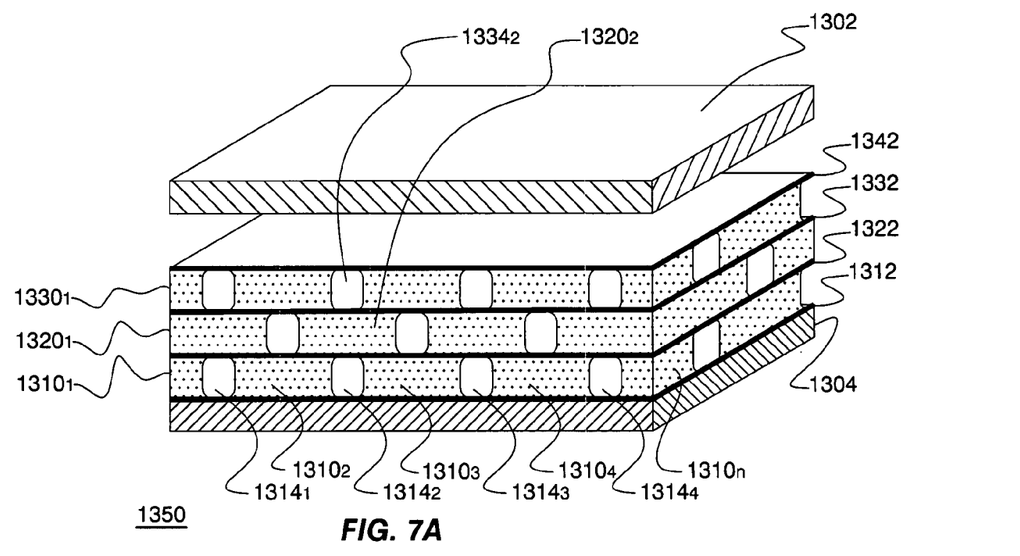
FIG. 7A shows a cross sectional perspective view of a multilayer compliant thermal contactor that is fabricated in accordance with one or more embodiments of the present invention.
Figure 7B:
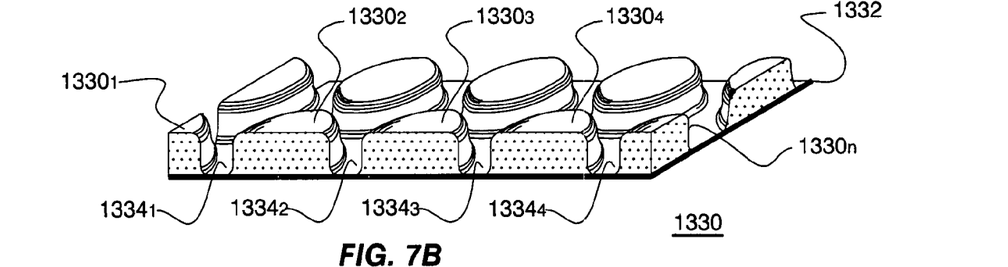
FIG. 7B shows a cross sectional perspective view of a layer of the multilayer compliant thermal contactor shown in FIG. 7A.

FIG. 7A shows a cross sectional perspective view of multilayer compliant thermal contactor 1350 that is fabricated in accordance with one or more embodiments of the present invention, and FIG. 7B shows a cross sectional perspective view of compliant layer 1330 of multilayer compliant thermal contactor 1350. In accordance with one or more such embodiments, and as one can readily appreciate from FIGS. 7A and 7B, one or more compliant layers comprised of compliant thermally conductive posts (shown in FIG. 7B) are juxtaposed in a stack to form multilayer compliant thermal coupler 1350 shown in FIG. 7A.

As shown in FIG. 7B, posts $1330_1$-$1330_n$ of layer 1330 are disposed on resilient metal film 1332 in an array with interstitial spaces $1334_1$-$1334_4$ disposed between the posts. Interstitial spaces $1334_1$-$1334_4$ allow the posts to expand laterally (into the interstitial spaces) whenever the posts are compressed vertically. In accordance with one or more embodiments of the present invention, posts $1330_1$-$1330_n$ are formed, for example and without limitation, of DC 577 silicone elastomer (available from Dow Corning Corporation of Midland, Mich.) which is filled, for example and without limitation, with 45% by weight of spherical silver particles having diameters in a range between about 0.005 and about 0.025 mm. In accordance with one or more such embodiments: (a) each of posts $1330_1$-$1330_n$ has a cross sectional area having a diameter of about 1.0 mm at a base of the post and a height of about 0.3 mm; (b) each of interstitial spaces $1334_1$-$1334_4$ is about 0.15 mm between adjacent posts; and (c) resilient metal film 1332 is an about 0.018 mm thick foil of copper alloy 7025 (available from Olin Brass of Bridgeport, Conn.).

As shown in FIG. 7A, compliant thermal contactor 1350 comprises layers 1310, 1320, and 1330 wherein: (a) layer 1310 has posts $1310_1$-$1310_n$ disposed on a first side of resilient metal film 1322; (b) layer 1320 has posts $1320_1$-$1320_n$ disposed on a second side of resilient metal film 1322; and (c) layer 1330 has posts $1330_1$-$1330_n$ disposed on resilient metal film 1332. As further shown in FIG. 7A, in accordance with one or more such embodiments, the structure comprised of layers 1310, 1320, and 1330 is disposed between optional thermally conductive layer 1312 and optional thermally conductive layer 1342. As such, layer 1310 is disposed between optional thermally conductive layer 1312 and resilient metal film 1322; layer 1320 is disposed between resilient metal films 1322 and 1332; and layer 1330 is disposed between resilient metal film 1332 and optional thermally conductive layer 1342. Further, as discussed above in conjunction with FIG. 7B, interstitial spaces $1314_1$-$1314_n$ are disposed between the posts of layer 1310, interstitial spaces $1324_1$-$1324_n$ (not labeled on FIG. 7A) are disposed between the posts of layer 1320, and interstitial spaces $1334_1$-$1334_n$ (not labeled on FIG. 7A) are disposed between the posts of layer 1330. In accordance with one or more embodiments of the present invention, a line perpendicular to a plane of a metal film and passing through a center axis (or longitudinal axis) of a post disposed on the metal film also passes through an interstitial space on any layer adjacent to the layer containing the post. Further, in accordance with one or more such embodiments, this construct holds for most or all of the posts in the contactor. This construct may be further understood in conjunction with FIG. 7A by noting that a line through a center axis of post $1320_2$ in layer 1320 would pass through interstitial space $1334_2$ of adjacent layer 1330 and interstitial space $1314_2$ of adjacent layer 1310. Thus, a line through a center axis of a post in layer 1320 is offset laterally from a line through a center axis of a post in layer 1310 and 1330.

As further shown in FIG. 7A, in use, multilayer compliant thermal contactor 1350 is: (a) attached to plate 1302 and cold plate 1304 (in accordance with one or more such embodiments, one or more of optional thermally conductive layers 1312 and 1342 may not be used so that the posts can be adhered to plate 1302 and cold plate 1304); or (b) abutted to plate 1302 and cold plate 1304 (in accordance with one or more such embodiments, one or more of optional thermally conductive layers 1312 and 1342 may be used to provide better release properties, or the posts may comprise one or more release mechanisms described herein). In accordance with one or more embodiments of the present invention, compliant thermal contactor 1350 provides a thermal connection between plate 1302 and cold plate 1304 when plate 1302 is urged downward into contact with a top surface of multilayer compliant thermal contactor 1350. By way of example, plate 1302 is a semiconductor device that is cooled by conduction of heat through multilayer compliant thermal contactor 1350 to cold plate 1304.

Figure 7C:
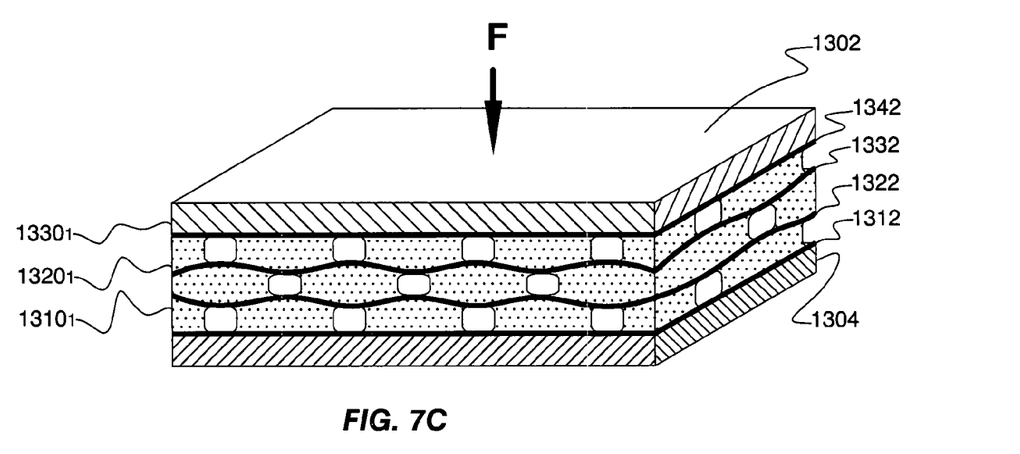
FIG. 7C shows a cross sectional perspective view of the multilayer compliant thermal contactor shown in FIG. 7A after a force has been applied thereto.

FIG. 7C shows a cross sectional perspective view of multilayer compliant thermal contactor 1350 after force F has been applied thereto in a direction perpendicular to a surface of plate 1302 to urge plate 1302 downward into contact with multilayer compliant thermal contactor 1350. As shown in FIG. 7C, the application of force F causes resilient metal films 1322 and 1332 to wrinkle and distort, thereby allowing compression of multilayer compliant thermal contactor 1350 by an amount larger than that obtained by compression of elastomeric posts $1310_1$-$1310_n$, $1320_1$-$1320_n$, and $1330_1$-$1330_n$ alone. In addition, in accordance with one or more embodiments described above wherein each post is juxtaposed to an interstitial space in any adjacent layer, increased wrinkling of resilient metal films 1322 and 1332 occurs to provide an increased amount of vertical compliance of multilayer compliant thermal contactor 1350. This result is achieved because a central portion of each post can deflect an adjacent resilient metal film into an interstitial space between posts in an adjacent layer while also allowing a distortion of the resilient metal film in a region of attachment therebetween so as to increase such deflection.

Figure 7D:
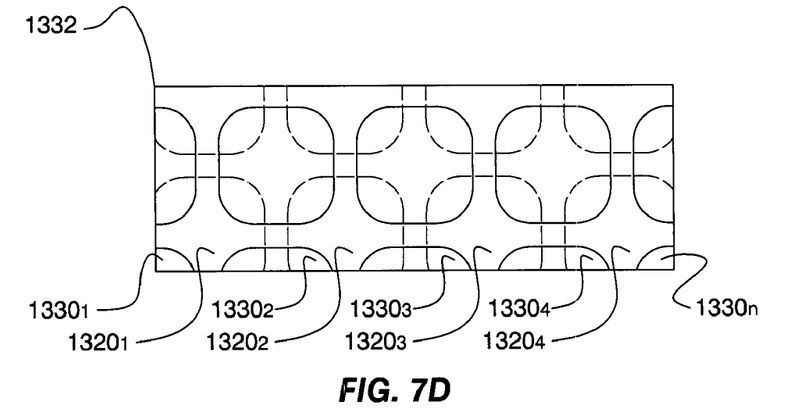
FIG. 7D shows a top view of the layer shown in FIG. 7B.

FIG. 7D shows a top view of layer 1330 shown in FIG. 7B. As shown in FIG. 7D, posts $1330_1$-$1330_n$ of layer 1330 are disposed on a top side of resilient metal film 1332 so that centers of posts $1330_1$-$1330_n$ lie above interstitial spaces between posts $1320_1$-$1320_n$ disposed on a bottom side of resilient metal film 1332.

Figure 7E:
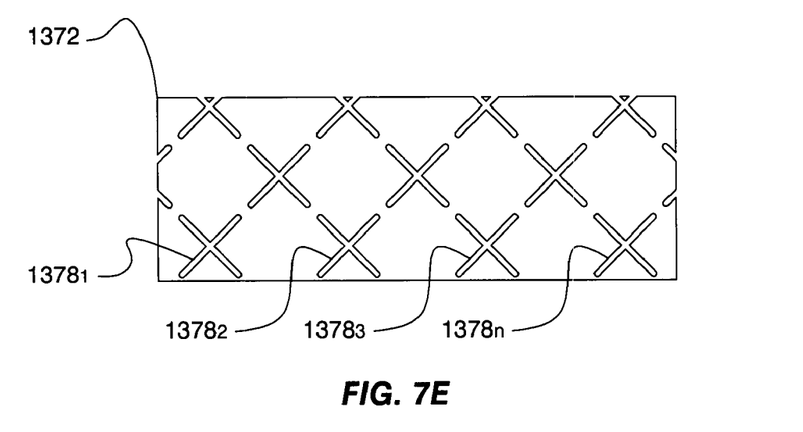
FIGS. 7E shows a top view of a resilient metal film used to fabricate one or more further embodiments of the present invention.

FIG. 7E shows a top view of resilient metal film 1372 that is used to fabricate one or more further embodiments of the present invention. As shown in FIG. 7E, resilient metal film 1372 is perforated in a pattern of cuts $1378_1$-$1378_n$ (for example and without limitation, a pattern of cross cuts) to enhance distortion of the film when it is incorporated into a compliant thermal contactor like compliant thermal contactor 1350. One of ordinary skill in the art will readily appreciate that further embodiments exist wherein resilient metal film 1372 is cut without being perforated, and that still further embodiments exist where resilient metal film may be thinner where it is disposed over interstitial spaces.

Figure 7F:
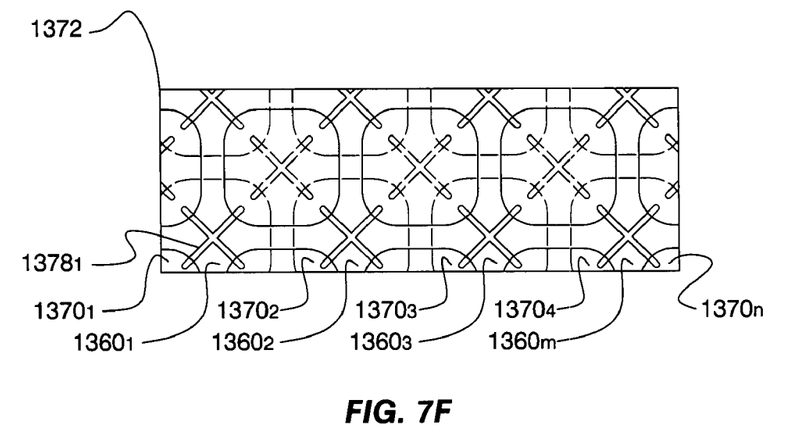
FIG. 7F shows a top view of the layer shown in FIG. 7B wherein the layer utilizes the resilient metal film layer shown in FIG. 7E.

FIG. 7F shows a top view of a layer like layer 1330 shown in FIG. 7B wherein resilient metal film 1332 of layer 1330 has been replaced with resilient metal film 1372 shown in FIG. 7E. As shown in FIG. 7F, compliant posts $1370_1$-$1370_n$ of the layer are disposed on a top side of resilient metal film 1372 so that centers of posts $1370_1$-$1370_n$ lie above (a) interstitial spaces between posts $1360_1$-$1360_n$ disposed on a bottom side of resilient metal film 1332; and (b) selected ones of cuts $1378_i$. Further, compliant posts $1360_1$-$1360_n$ are disposed on a bottom side of resilient metal film 1372 so that centers of compliant posts $1360_1$-$1360_n$ lie below selected ones of cuts $1378_j$. In accordance with one or more such embodiments of the present invention, a vertical force applied to the top of posts $1370_1$-$1370_n$: (a) moves the posts downward into interstitial spaces between bottom posts $1360_1$-$1360_n$; (b) distorts resilient metal film 1372; and (c) deflects cuts $1378_1$-$1378_n$ downward. It will be readily understood by one of ordinary skill in the art that further embodiments of the present invention exist wherein other cut patterns and configurations, perforation patterns and configurations, dimple patterns and configurations, and/or thinned section patterns and configurations may be used to increase the flexibility of resilient metal film 1372. Such cut (or slit), perforation, dimple, and thinned section patterns and configurations may be fabricating using any one of a number of methods that are well known to those of ordinary skill in the art such as, for example and without limitation, embossing, dimpling, thinning, etching, and so forth.

Although embodiments have been described wherein resilient films 1322 and 1332 are metal, further embodiments of the present invention exist wherein resilient films 1322 and 1332 are comprised of any one of a large number of materials having suitable thermal conductivity and resilience such as, for example and without limitation, woven carbon fibers, screens, metal mesh materials. In addition, optional films 1312 and 1342 may be fabricated from any material having a suitable thermal conductivity for a particular application. In further addition, the posts may be fabricated using any of the materials and structures (for example, spring structures) described herein as long as they can provide a suitable thermal conductivity and resilience for a particular application.

Embodiments of the present invention described above are exemplary. As such, many changes and modifications may be made to the disclosure set forth above while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. Further, as is apparent to one skilled in the art, the embodiments may be used for making connections to semiconductor devices, electronic devices, electronic subsystems, cables, and circuit boards and assemblies.

The scope of the invention should be determined with reference to the appended claims along with their full scope of equivalents.

What is claimed is:

1. A compliant thermal contactor comprising:
   a thermally conductive carrier;
   a plurality of thermally conductive, compliant posts disposed in an array on a first surface of the carrier wherein interstitial spaces are disposed between the posts so that the posts can expand laterally into the interstitial spaces whenever the posts are compressed vertically; and
   a continuous resilient metal film disposed on top of a plurality of posts of the array;
   wherein the posts are formed of a material comprising a polymeric elastomer and a thermally conductive filler.

2. The compliant thermal contactor of claim 1 wherein the thermal conductive filler comprises an amount in a range from about 10% by weight to about 85% by weight of the posts.

3. A compliant thermal contactor comprising:
   a thermally conductive carrier; and
   a plurality of thermally conductive, compliant posts disposed in an array on one or more surfaces of the carrier wherein interstitial spaces are disposed between the posts so that the posts can expand laterally into the interstitial spaces whenever the posts are compressed vertically; and
   a continuous thin resilient metal film disposed on top of a plurality of the compliant posts;
   wherein:
   the posts are formed of material comprising a polymeric elastomer and a thermally conductive filler; and
   the posts include spring structures.

4. A structure comprising an integrated circuit and a heat spreader or a heat sink in thermal contact with a first side and a second side, respectively, of a compliant thermal contactor that includes:
   a thermally conductive carrier;
   a plurality of thermally conductive, compliant posts disposed in an array on a first surface of the carrier wherein interstitial spaces are disposed between the posts so that the posts can expand laterally into the interstitial spaces whenever the posts are compressed vertically; and
   a continuous thin film disposed on top of a plurality of the posts.

5. A compliant thermal contactor comprising:
   a thermally conductive carrier having resilient portions; and
   a plurality of thermally conductive, compliant posts disposed in an array on top and bottom surfaces of the carrier;
   wherein:
   the posts are disposed on resilient portions of the thermally conductive carrier wherein interstitial spaces are disposed between the posts so that the posts can expand laterally into the interstitial spaces whenever the posts are compressed vertically.

6. The compliant thermal contactor of claim 5 wherein:
   the posts include a spring structure.

7. The compliant thermal contactor of claim 5 wherein:
   a top surface of a post is coated with a layer of thermally conductive material.

8. The compliant thermal contactor of claim 7 wherein:
   the layer of thermally conductive material is a thin metal film.

9. The compliant thermal contactor of claim 5 wherein:
   the plurality of thermally conductive, compliant posts are disposed in an array on both surfaces of the carrier; and
   the posts disposed on one side of the carrier are in staggered positions relative to the posts disposed on the other surface of the carrier.

10. The compliant thermal contactor of claim 5 wherein:
    the resilient portions of the thermally conductive carrier comprises a resilient metal layer with slots cut therethrough.

11. The compliant thermal contactor of claim 5 wherein:
    the resilient portions of the thermally conductive carrier comprise a screen that includes a pattern of holes cut therethrough.

12. The compliant thermal contactor of claim 1 wherein:
    the resilient metal film is a metal foil deformed to the shape of the compliant posts.

13. The compliant thermal contactor of claim 1 wherein:
    the resilient metal film is coated with a low temperature melting solder.

14. The of claim 1 wherein:
    the resilient metal film is a conformal coating.

15. The structure of claim 4 wherein:
    the film further includes an adhesive coating.

16. The structure of claim 15 wherein:
    the adhesive coating includes a release film.

* * * * *